(12) United States Patent
Ngo et al.

(10) Patent No.: US 7,288,975 B2
(45) Date of Patent: Oct. 30, 2007

(54) METHOD AND APPARATUS FOR FAIL-SAFE AND RESTARTABLE SYSTEM CLOCK GENERATION

(75) Inventors: Hung C. Ngo, Austin, TX (US); Gary D. Carpenter, Austin, TX (US); Fadi H. Gebara, Austin, TX (US); Jente B. Kuang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/260,563

(22) Filed: Oct. 27, 2005

(65) Prior Publication Data

US 2007/0096782 A1    May 3, 2007

(51) Int. Cl.
    *H03L 7/06*       (2006.01)
(52) U.S. Cl. ..................... 327/156; 327/146
(58) Field of Classification Search ........ 327/147–150, 327/156–159; 331/1 R, 17, 25, DIG. 2; 375/373, 375, 376; 709/200, 231, 245; 714/700
See application file for complete search history.

(56) References Cited

U.S. PATENT DOCUMENTS

| | | | |
|---|---|---|---|
| 4,893,271 A | 1/1990 | Davis et al. ............... 713/501 |
| 4,931,748 A | 6/1990 | McDermott et al. ........ 331/1 R |
| 4,943,788 A * | 7/1990 | Laws et al. .................... 331/11 |
| 5,142,247 A * | 8/1992 | Lada et al. .................... 331/14 |
| 5,294,894 A | 3/1994 | Gebara ....................... 331/1 R |
| 5,774,701 A | 6/1998 | Matsui et al. ............... 713/501 |
| 5,903,748 A * | 5/1999 | McCollough et al. ....... 713/503 |
| 5,991,888 A * | 11/1999 | Faulkner et al. ............ 713/501 |
| 6,078,225 A * | 6/2000 | Bontekoe et al. ............. 331/14 |
| 6,111,442 A * | 8/2000 | Aulet et al. .................. 327/156 |
| 6,140,854 A * | 10/2000 | Coddington et al. ........ 327/158 |
| 6,154,095 A * | 11/2000 | Shigemori et al. ............ 331/16 |
| 6,353,369 B1 | 3/2002 | Boerstler ....................... 331/57 |
| 6,356,156 B2 * | 3/2002 | Wesolowski ................. 331/10 |
| 6,703,877 B2 * | 3/2004 | Kobayashi et al. ......... 327/156 |
| 6,861,883 B2 * | 3/2005 | Hirota et al. ................ 327/149 |
| 7,098,714 B2 * | 8/2006 | Lin ............................. 327/291 |
| 7,102,391 B1 * | 9/2006 | Sun et al. ...................... 327/10 |
| 2004/0221208 A1 | 11/2004 | Floyd et al. ................... 714/50 |

* cited by examiner

*Primary Examiner*—Kenneth B. Wells
*Assistant Examiner*—Thomas J. Hiltunen
(74) *Attorney, Agent, or Firm*—Mitch Harris, Atty at Law, LLC; Andrew M. Harris; Casimer K. Salys

(57) ABSTRACT

A method and apparatus for fail-safe and restartable system clock generation provides recovery from failures due to incorrect clock generator settings or from marginal clock distribution components. Clock failure is detected at a point along the clock distribution path between the output of the clock generator and the downstream circuits. If a clock failure is detected, a second clock, which may be the clock generator reference clock, is used to operate the downstream circuits. The clock generator, which may be a phase-lock loop, is then restarted, either with a predetermined loop filter voltage at which downstream circuits are guaranteed to operate, or with a divider setting on the output of the clock generator that reduces the frequency so that downstream circuits are guaranteed to operate. Parameters of the clock generator can thereby be reset and operating conditions determined before restoring the output of the clock generator to the downstream circuits.

24 Claims, 4 Drawing Sheets

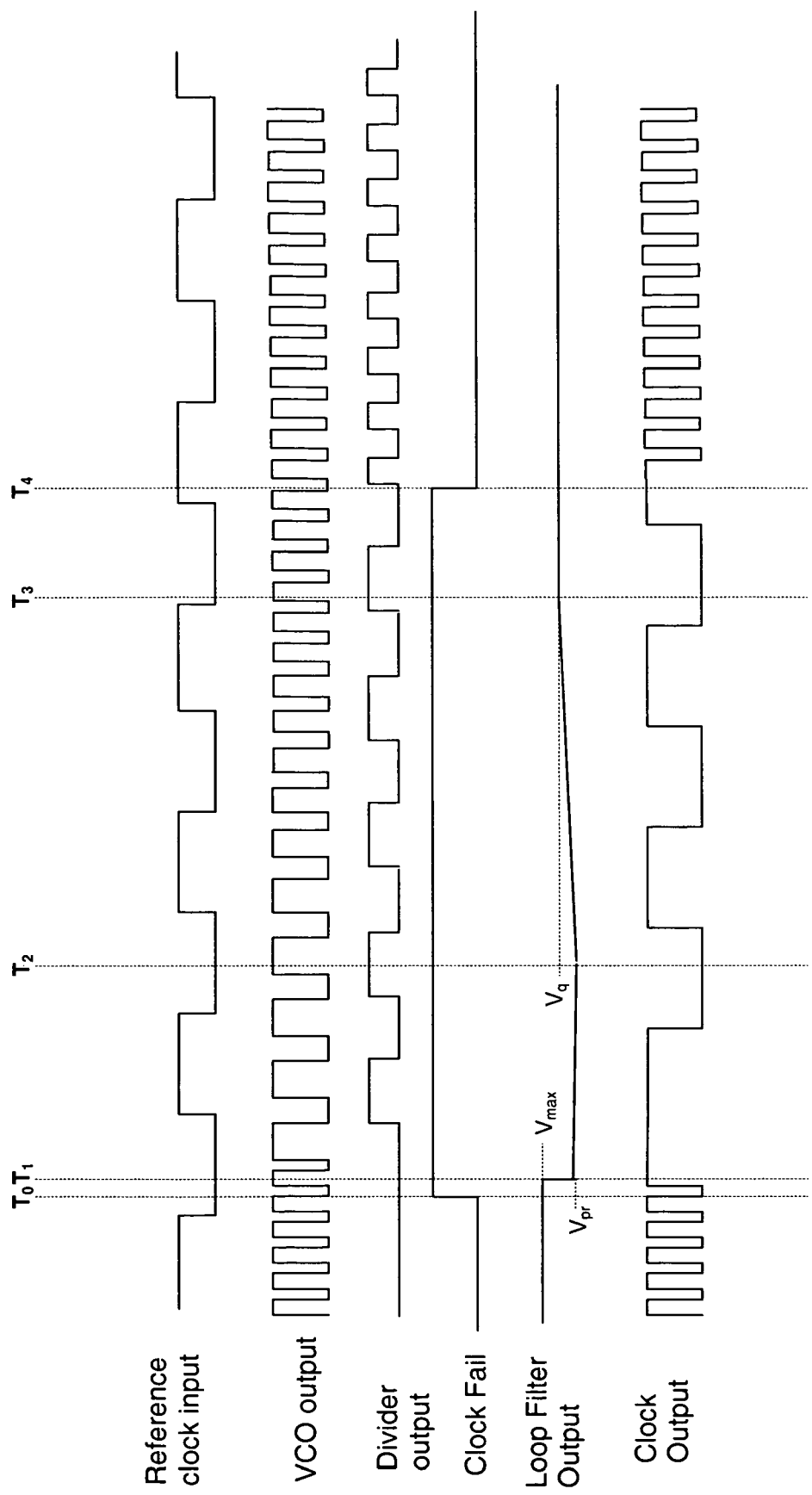

METHOD AND APPARATUS FOR FAIL-SAFE AND RESTARTABLE SYSTEM CLOCK GENERATION

This invention was made with government support under PERCSII, DARPA NBCH3039004. THE GOVERNMENT HAS CERTAIN RIGHTS IN THIS INVENTION.

BACKGROUND OF THE INVENTION

1. Technical Field

The present invention relates generally to clock generation circuits, and more particularly, to a fail-safe and restartable phase-lock loop (PLL) clock generating circuit.

2. Description of the Related Art

Present day high-speed processors and other logical devices having a high frequency internal clock typically use a phase-lock loop (PLL) to generate the internal clock from lower frequency external clock source or resonant circuit. The frequency of the internal clock is often programmable via parameters generally set up by initialization parameters set by a service processor or by the primary processor under direction of a boot management program, generally stored in non-volatile memory. Many techniques have been developed for detecting PLL clock failure and providing a redundant clock in the presence of such a failure.

However, under certain conditions, and particularly in high-speed processors where the operating clock is close to the upper limit of circuit operability, the parameters setting the internal clock frequency may be such that the selected frequency is too high for either portions of the PLL circuit or circuits interposed between the PLL clock generator and the final clock distribution. From the oscillator output of the PLL to the points at which the output is applied as a processor clock or clock for other logic, level shifters, dividers and buffers are commonly present in large numbers, and failure of any one of the downstream circuits can occur if the clock distribution to those circuits fails. When operating near the upper frequency limit of the above-mentioned circuits, the programmed frequency of the PLL is critical, and if set such that the generated frequency will be too high, attempts to restart the PLL will continuously fail.

It is therefore desirable to provide a method and apparatus for detecting the above failure conditions in a logical system while operating the system in a fail-safe manner and restarting the clock generator such that the failure condition is avoided so that parameters causing the failure condition can be readjusted.

SUMMARY OF THE INVENTION

The objective of providing fail-safe operation, failure detection and clock generator restart so that parameters causing the failure condition can be adjusted is provided in a method and apparatus.

The method and apparatus detect that a clock failure has occurred in a first clock source set for a high operating frequency and provide a second clock source for operating downstream circuits. The clock generator that generates the first clock source is then restarted by setting initial conditions of the clock generator such that a clock frequency lower than the high operating frequency is initially generated.

The clock generator may be a PLL that is started at a low frequency by presetting the loop filter to a predetermined starting voltage that will guarantee operation of all downstream circuits. Alternatively, or in combination, a divider that is coupled between the clock generator output and downstream circuits may be initially set to a division factor that will guarantee operation of all downstream circuits.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

FIG. 4 is a timing diagram showing signals within the system of FIG. 1.

DESCRIPTION OF ILLUSTRATIVE EMBODIMENT

The present invention provides a clock generating subsystem for processors or other digital circuits that is both fail-safe and restartable. In particular, the present invention provides a clock generating subsystem that can recover from faults or incorrect parameter settings that cause the clock output to be generated at a frequency too high for operation of downstream circuits, including feedback circuits required for controlling the output frequency of the clock generator. For example, in general, a phase-lock loop (PLL) clock generator includes a frequency divider providing feedback from the output of a voltage controlled oscillator (VCO). The VCO control voltage is generated via a phase comparison of the divided output frequency and a reference frequency. When the feedback divider fails due to too high a VCO output frequency, the VCO control voltage generally rises to its maximum value, as the frequency of the feedback signal is zero, indicating a need to raise the frequency. As such, once a failure of the feedback divider occurs or parameters of the PLL are improperly set such that the feedback divider will not operate, the clock generator is forced to the maximum VCO frequency. The present invention provides a solution to the above-described problem, as well as providing a means for overcoming other clock failure modes, such as detected failures of downstream circuits or clocks that cannot operate at the currently programmed PLL frequency.

Figure 1:
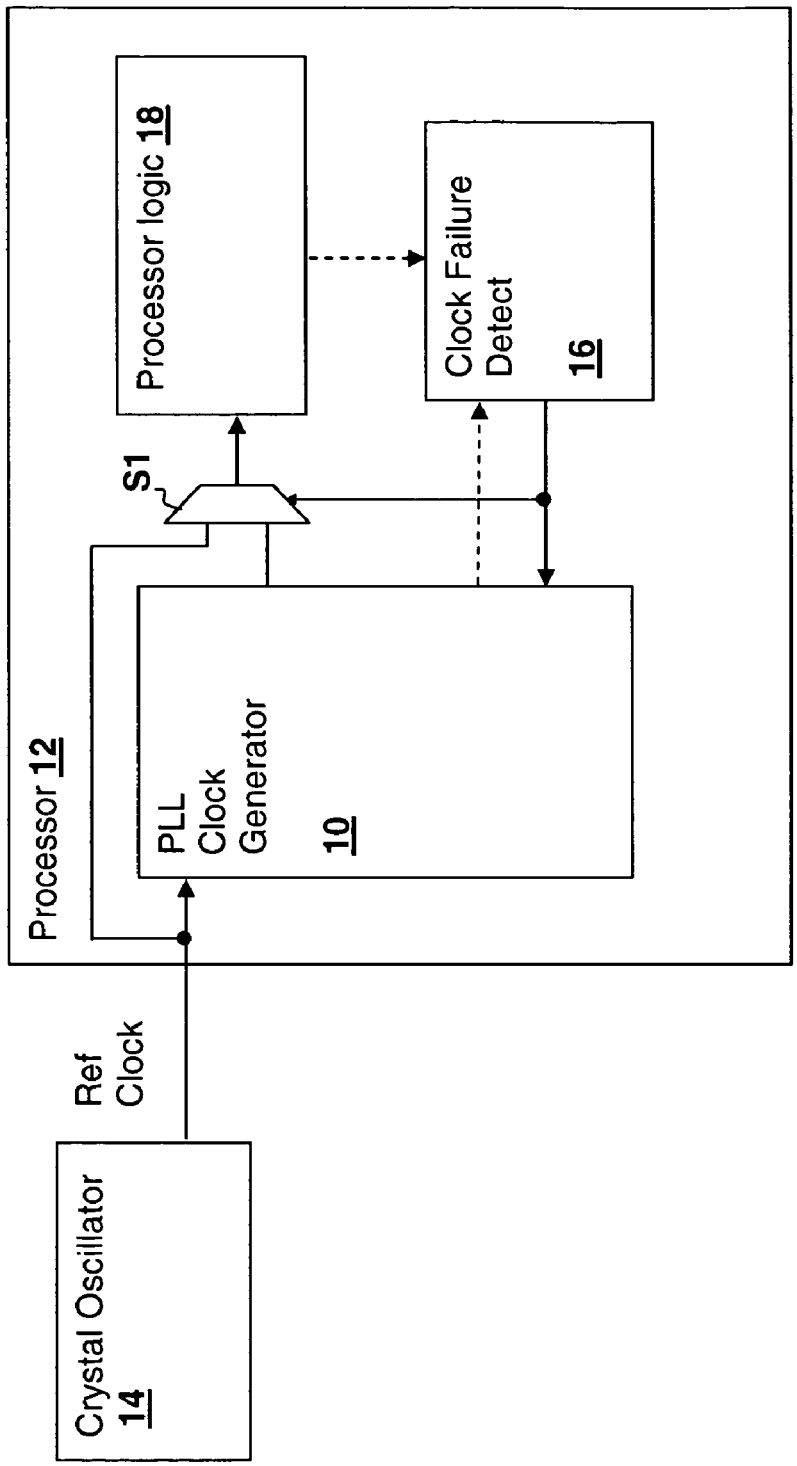
FIG. 1 is a block diagram of a processing system in accordance with an embodiment of the invention.

With reference now to the figures, and in particular with reference to FIG. 1, there is depicted a block diagram of a processor including a clock generator in accordance with an embodiment of the present invention. A crystal oscillator 14 or other suitable clock source, provides a reference clock to processor 12. The reference clock is generally a much lower frequency than the internal clock that operates the processor logic, and may be distributed to multiple processors and other components to provide for synchronization and/or to lower the cost and power consumed by clock generation and distribution.

Within processor 12, a PLL clock generator 10 generates a high-frequency output that is provided to processor logic 18 via a selector S1. Selector S1 is operated by a control signal provided by a clock failure detector 16 that receives inputs from one or more of PLL clock generator 10 and a signal point within processor logic 18 that represents a signal derived from the high-frequency output. Under normal operating conditions, selector S1 selects the output of PLL clock generator 10 to provide the high-frequency clock to processor logic 18. However, when clock failure detect 16 detects that the high-frequency clock or a signal derived from that clock has failed, the control signal is set by clock failure detect 16 to select the input reference clock Ref Clock provided by crystal oscillator 14 as the clock source, providing fail-safe operation, while the failure condition is removed by restarting PLL clock generator 10 with one or more predetermined initial conditions that guarantee operation of the failing circuits, unless a catastrophic failure has occurred (e.g., a circuit downstream of the high-frequency clock is not merely inoperative at the higher clock frequency, but has actually failed).

While processor 12 provides an illustrative example of a logic circuit including a PLL clock generator 10, it will be understood that the present invention is not limited in application to processors, nor is the use of a PLL a particular requirement of the present invention, as other circuits that generate clocks may also have settable conditions that may cause failure and can be made fail-safe and restartable via the techniques of the present invention.

Figure 2:
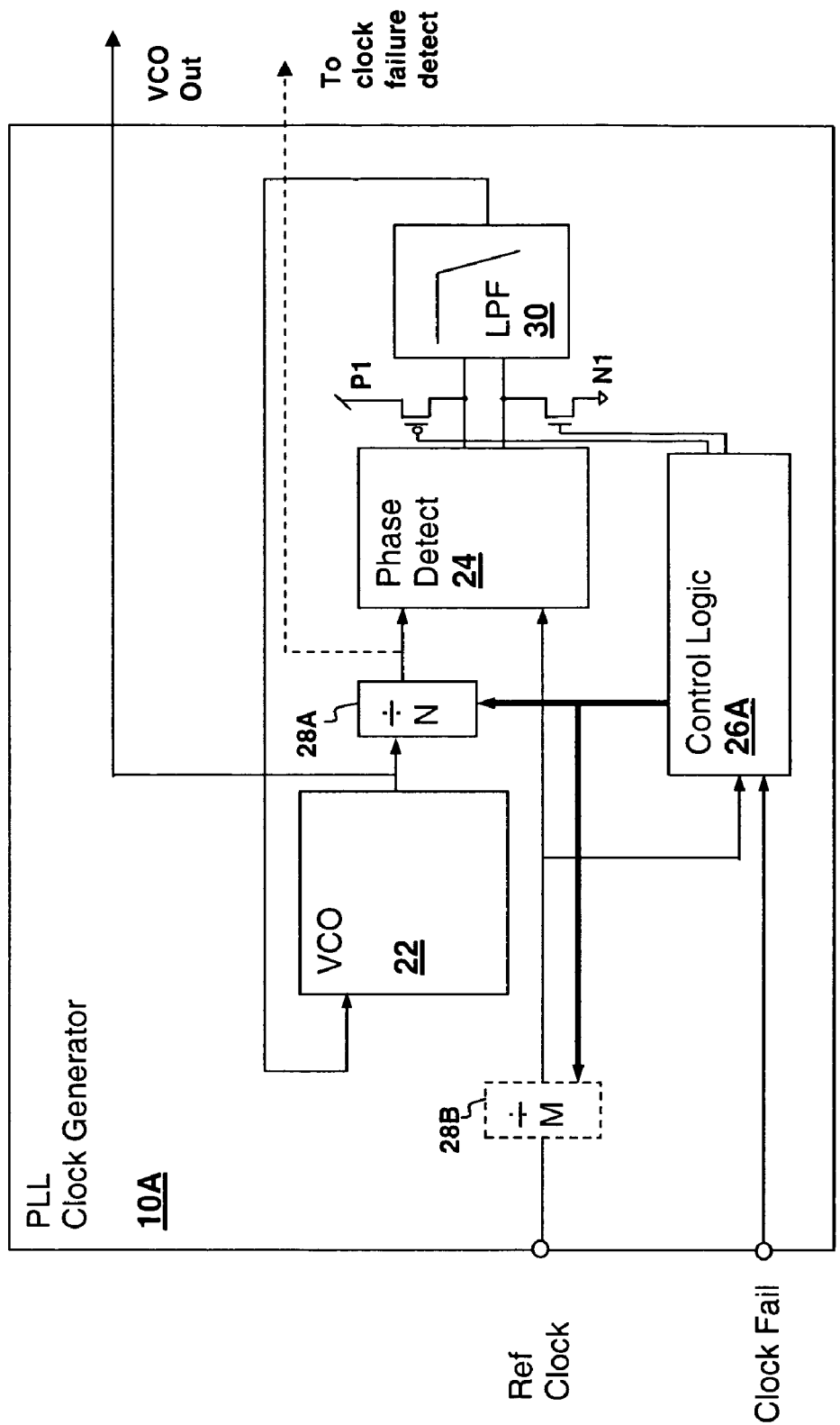
FIG. 2 is a block diagram a clock generator that may be used to implement clock generator 10 of FIG. 1 in accordance with an embodiment of the invention.

Referring now to FIG. 2, a clock generator circuit 10A as may be incorporated within processor 12 in accordance with an embodiment of the present invention is shown. A VCO 22 provides the high frequency clock output Clock Out of clock generator 10A and has a control voltage provided by a low pass loop filter 30 that receives correction pulses from a phase detector 24. Phase detector 24 compares the output of a frequency divider 28A to the reference clock Ref Clock, which may be optionally divided by a divider 28B to generate the correction pulses provided to loop filter 30. The output of frequency divider 28A is shown as optionally supplied to clock fail detect 16 of FIG. 1 for illustrative purposes. A control logic 26A receives the reference clock and a clock fail signal, and controls transistors P1 and N1 to apply a predetermined voltage level for a number of reference clock periods to loop filter 30, setting an initial condition for recoverably restarting clock generator 10A. The values of dividers 28A and 28B may also be adjusted by control logic 26A or alternatively by set by processor logic or an external service processor through an input mechanism in response to the Clock Fail signal, so that the initial condition of the clock generator is such that the failure will be removed when the initial condition has been set. The combination of the above-described operation along with the operation of clock failure detect 16 and selector S1 of FIG. 1 provides fail-safe and restartable operation that recovers from failures such as improper setting of PLL parameters (e.g., the division factors of dividers 28A and 28B) and/or marginal components in the clock distribution or internal PLL feedback paths.

Figure 3:
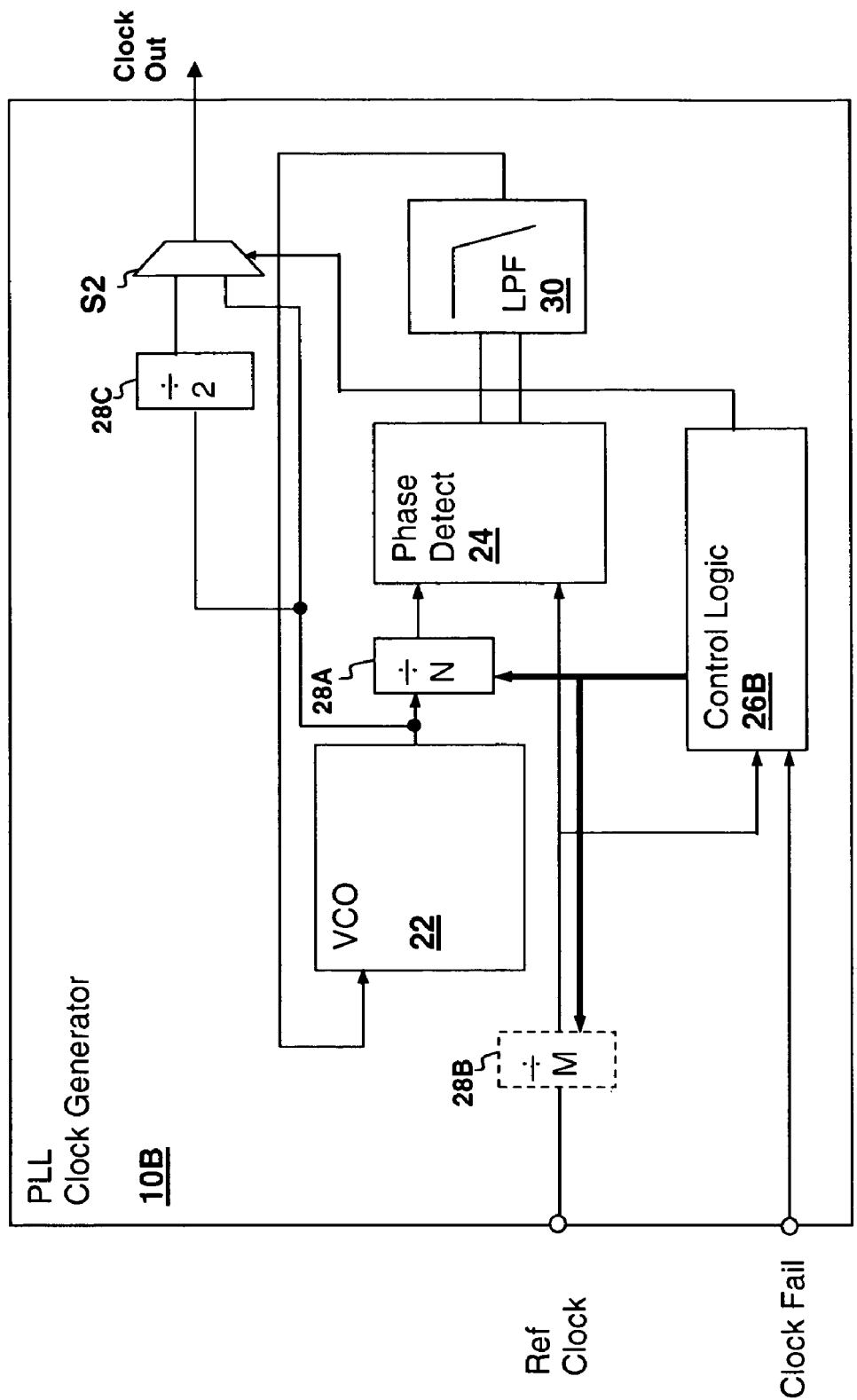
FIG. 3 is a block diagram a clock generator that may be used to implement clock generator 10 of FIG. 1 in accordance with another embodiment of the invention.

Referring now to FIG. 3, a clock generator circuit 10B as may be incorporated within processor 12 in accordance with another embodiment of the present invention is shown. Clock generator circuit 10B is similar to clock generator circuit 10A of FIG. 2 and therefore only differences between them will be described below. Clock generator circuit 10B does not include transistors N1 and P1 and associated control logic for setting the initial condition of loop filter 30. However, the techniques of FIG. 2 and FIG. 3 can be combined and used in conjunction. Clock generator 10B provides another mechanism for setting an initial condition for recovery: control logic 26B controls the state of a selector S2 that selects the output of VCO 22 as the high-frequency clock output under normal operating conditions and selects a division of the output of VCO 22 provided by a divider 28C when a clock failure is detected as indicated by the Clock Fail input signal. The result is that clock generator 10B provides a frequency of half of the frequency (or another division alternatively) of the high-frequency output until the clock failure is overcome. When the clock failure is overcome, the output of VCO 22 is restored as the high frequency output.

Referring now to FIG. 4, a timing diagram depicting operation of the circuit of FIG. 1, is depicted. Prior to time $T_0$, VCO 22 is generating a frequency such that the Divider Output signal (the output of divider 28A) does not toggle. Clock failure detect 16 detects the failure condition and selects the Reference clock input signal to provide the Clock Output signal while clock generator 10A is restarted. At time $T_1$, control logic 26A enables transistors N1 and P1 which lower the Loop Filter Output voltage from time $T_1$ to $T_2$. At time $T_2$, transistors N1 and P1 are disabled, and the Loop Filter Output voltage rises to a voltage $V_q$ at which a proper output frequency is generated. At time $T_3$, clock failure detect 16 determines that the clock failure has been removed and at time $T_4$, selector S1 is set to restore the VCO 22 output clock as the Clock Output signal.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method of generating a clock signal for a digital circuit, comprising:
    determining that a first clock signal supplying said digital circuit has failed at a downstream node of a clock distribution path supplied by an output of a clock generator, wherein said first clock signal is derived from said output of said clock generator, wherein said determining further determines whether or not said output of said clock generator has failed;
    responsive to said determining that said first clock signal has failed, supplying a second clock signal in place of said first clock signal so that said digital circuit is operated, wherein said supplying said second clock signal is further performed responsive to determining that said output of said clock generator has failed;
    setting an initial condition of said clock generator so that said clock generator initially generates said first clock signal at or below a predetermined frequency at which said digital circuit is guaranteed to operate;
    restarting said clock generator at said predetermined frequency; and
    restoring said first clock signal to said digital circuit, whereby said supplying said second clock signal is terminated.

2. The method of claim 1, further comprising generating said first clock signal from a reference clock with a phase-lock loop.

3. The method of claim 2, wherein said supplying supplies said reference clock in place of said first clock signal.

4. The method of claim 2, further comprising programming parameters of said phase-lock loop subsequent to said supplying and prior to said restarting, whereby said phase-lock loop is restored to an operating condition by said restarting and wherein said determining determines that said first clock signal is no longer failing.

5. The method of claim 2, wherein said setting an initial condition sets a predetermined voltage level at a loop filter of said phase-lock loop, whereby said restarting restarts said phase-lock loop at a frequency corresponding to said predetermined voltage level.

6. The method of claim 2, wherein said wherein said setting an initial condition sets a division factor of a divider at an output of said phase-lock loop, whereby said restarting restarts said clock generator to generate said first clock signal at a frequency lower than the frequency of said first clock signal when said determining determines that said first clock signal has failed.

7. The method of claim 1, wherein said wherein said setting an initial condition sets a division factor of a divider at an output of said clock generator, whereby said restarting restarts said clock generator to generate said first clock signal at a frequency lower than the frequency of said first clock signal when said determining determines that said first clock signal has failed.

8. A circuit, comprising:
a clock generator for generating a clock output;
a selector for selecting between said clock output of said clock generator and a secondary clock source and supplying a selected clock to a downstream clock distribution path;
a clock failure detector for detecting when a signal within said downstream clock distribution path has failed, and wherein said clock failure detector has at least one output coupled to said selector and said clock generator for selecting said secondary clock source, wherein said clock failure detector has an input connected to said clock output of said clock generator, whereby said clock failure detector further detects when said clock output has failed at said clock output of said clock generator; and
a control circuit for setting an initial condition of said clock generator in response to said clock failure detector detecting a failure so that said clock generator initially generates said first clock signal at or below a predetermined frequency at which a digital circuit coupled to said downstream distribution path is guaranteed to operate, and wherein said clock generator is restarted at said initial condition in response to said detected failure.

9. The circuit of claim 8, wherein said clock failure detector has an input connected to said signal within said downstream clock distribution path, whereby said clock failure detector detects when either of said clock output or a circuit within said downstream clock distribution path has failed.

10. The circuit of claim 8, wherein said clock generator is a phase-lock loop having an input for receiving a reference clock and wherein said clock generator generates said clock output locked to said reference clock.

11. The circuit of claim 10, wherein said selector selects between said clock output of said clock generator and said reference clock, whereby said reference clock is supplied as said secondary clock source when said clock failure detector detects said failure.

12. The circuit of claim 10, wherein said control circuit causes reprogramming of parameters of said phaselock loop prior to said restarting, whereby said phaselock loop is restored to an operating condition by said restarting.

13. The circuit of claim 10, wherein said phase-lock loop includes a loop filter and wherein said circuit further comprises:
a reference source;
a switching circuit for applying said reference source to said loop filter to set said loop filter to a predetermined voltage level, and wherein said control circuit activates said switching circuit in response to detecting said failure, whereby said control circuit restarts said phase-lock loop at a frequency corresponding to said predetermined voltage level.

14. The circuit of claim 10, wherein said clock generator further comprises a divider for dividing a frequency of said clock output of said phase-lock loop, wherein said control circuit sets a division factor of said divider at a higher number in response to said clock failure detector detecting said failure whereby said control circuit restarts said clock generator to generate said clock output at a frequency lower than the frequency of said clock output when said failure is detected.

15. The circuit of claim 10, wherein said clock generator further comprises a divider for dividing a frequency of said clock output, wherein said control circuit sets a division factor of said divider at a higher number in response to said clock failure detector detecting said failure whereby said control circuit restarts said clock generator to generate said clock output at a frequency lower than the frequency of said clock output when said failure is detected.

16. A processor including a phase-lock loop clock generator circuit, said phase-lock loop generator circuit comprising:
an input for receiving an external reference clock;
a voltage controlled oscillator having a frequency control input and a clock output;
a loop filter having an output coupled to said frequency controlled input of said voltage controlled oscillator;
a selector for selecting between said external reference clock and said clock output of said voltage control oscillator as a processor clock in response to a control signal;
clock failure detection logic for detecting a failure of a signal within another logical circuit that is derived from said clock output has failed and generating said control signal to select said external reference clock as said processor clock, wherein said clock failure detection logic further detects a failure of said clock output and further generates said control signal in conformity therewith; and
control logic for restarting said phase-lock loop clock generator circuit in response to an indication of said detected failure, wherein said phase-lock loop circuit is restarted at a frequency substantially less than a frequency of said phase-lock loop circuit when said failure is detected, and wherein said control logic restores said control signal in response to said clock failure detection logic determining that said failure has been removed, whereby said clock output of said voltage controlled oscillator is restored as said processor clock.

17. The processor of claim 16, wherein said phase-lock loop circuit further comprises a frequency divider for dividing said clock output, and wherein said control logic selects an output of said frequency divider to supply to said other logical circuit in response to said indication, whereby said phase-lock loop circuit is restarted at a frequency that is a division of the frequency of said clock output when said failure is detected.

18. The processor of claim 16, wherein said loop filter has a control input for pre-setting said output of said loop filter to a predetermined voltage in response to said indication of said detected failure.

19. The processor of claim 16, wherein said another logical circuit includes at least one of a level shifter and a frequency divider and wherein said clock failure detection logic detects that said at least one of said level shifter and a frequency divider has failed, and wherein said control logic restarts said phase-lock loop to generate a clock output for which said at least one of said level shifter and a frequency divider is operational.

20. A method of generating a clock signal for a digital circuit, comprising:
   determining that a first clock signal supplying said digital circuit at a first frequency has failed at a downstream node of a clock distribution path supplied by an output of a clock generator, wherein said first clock signal is derived from said output of said clock generator, wherein said determining further determines whether or not said output of said clock generator has failed;
   responsive to said determining that said first clock signal has failed, supplying a second clock signal in place of the first clock signal so that said digital circuit is operated, wherein said supplying said second clock signal is further performed responsive to determining that said output of said clock generator has failed;
   setting an initial condition of said clock generator so that said clock generator initially generates said first clock signal at a predetermined second frequency less than said first frequency and at which said digital circuit is guaranteed to operate;
   restarting said clock generator at said second frequency; and
   restoring said first clock signal to said digital circuit, whereby said supplying said second clock signal is terminated.

21. A circuit, comprising:
   a clock generator for generating a clock output at a first frequency;
   a selector for selecting between said clock output of said clock generator and a secondary clock source and supplying a selected clock to a downstream clock distribution path;
   a clock failure detector for detecting when a signal within said downstream clock distribution path has failed, and wherein said clock failure detector has at least one output coupled to said selector and said clock generator for selecting said secondary clock source, wherein said clock failure detector has an input connected to said clock output of said clock generator, whereby said clock failure detector further detects when said clock output has failed at said clock output of said clock generator; and a control circuit for setting an initial condition of said clock generator in response to said clock failure detector detecting a failure so that said clock generator initially generates said first clock signal at predetermined second frequency less than said first frequency and at which a digital circuit coupled to said downstream distribution path is guaranteed to operate, and wherein said clock generator is restarted at said initial condition in response to said detected failure.

22. A processor including a phaselock loop clock generator circuit, said phase-lock loop generator circuit comprising:
   an input for receiving an external reference clock;
   a voltage controlled oscillator having a frequency control input and a clock output;
   a loop filter having an output coupled to said frequency controlled input of said voltage controlled oscillator;
   a selector for selecting between said external reference clock and said clock output of said voltage control oscillator as a processor clock in response to a control signal;
   clock failure detection logic for detecting a failure of a signal within another logical circuit that is derived from said clock output has failed and generating said control signal to select said external reference clock as said processor clock; and
   control logic for restarting said phase-lock loop clock generator circuit in response to an indication of said detected failure, wherein said phase-lock loop circuit is restarted at a frequency substantially less than a frequency of said phase-lock loop circuit when said failure is detected, and wherein said control logic restores said control signal in response to said clock failure detection logic determining that said failure has been removed, whereby said clock output of said voltage controlled oscillator is restored as said processor clock, and wherein said another logical circuit includes a level shifter and a frequency divider and wherein said clock failure detection logic detects that said at least one of said level shifter and frequency divider has failed, and wherein said control logic restarts said phase-lock loop to generate a clock output for which said level shifter and frequency divider are operational.

23. The processor of claim 22, wherein said control logic selects an output of said frequency divider to supply to said other logical circuit in response to said indication, whereby said phase-lock loop circuit is restarted at a frequency that is a division of the frequency of said clock output when said failure is detected.

24. The processor of claim 22, wherein said loop filter has a control input for presetting said output of said loop filter to a predetermined voltage in response to said indication of said detected failure.

* * * * *